United States Patent
Kobayashi et al.

(10) Patent No.: US 7,439,605 B2
(45) Date of Patent: Oct. 21, 2008

(54) SEMICONDUCTOR DEVICE AND METHOD FOR MANUFACTURING THE SAME

(75) Inventors: Hitoshi Kobayashi, Kanagawa (JP); Tomoki Inoue, Hyogo (JP); Satoshi Aida, Hyogo (JP); Yasushi Takahashi, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 551 days.

(21) Appl. No.: 11/117,331

(22) Filed: Apr. 29, 2005

(65) Prior Publication Data

US 2006/0197151 A1 Sep. 7, 2006

(30) Foreign Application Priority Data

Mar. 4, 2005 (JP) ............................ P2005-060862

(51) Int. Cl.
 *H01L 29/76* (2006.01)
(52) U.S. Cl. ...................... 257/522; 257/341; 257/328; 257/401; 257/510
(58) Field of Classification Search .................. 257/522
See application file for complete search history.

(56) References Cited

U.S. PATENT DOCUMENTS

| 2,974,062 | A | * | 3/1961 | Collier | ........................ 523/466 |
|---|---|---|---|---|---|
| 5,219,606 | A | * | 6/1993 | Homma et al. | ................. 427/65 |
| 5,298,328 | A | * | 3/1994 | Abe et al. | .................... 428/403 |
| 6,566,243 | B2 | * | 5/2003 | Gaynor | ........................ 438/622 |
| 6,653,718 | B2 | * | 11/2003 | Leung et al. | ................. 257/634 |
| 6,740,931 | B2 | | 5/2004 | Kouzuki et al. | |
| 7,262,477 | B2 | * | 8/2007 | Okumura et al. | ............. 257/510 |
| 2004/0016962 | A1 | * | 1/2004 | Okumura et al. | ............. 257/330 |

FOREIGN PATENT DOCUMENTS

| JP | 2002-217415 | 8/2002 |
|---|---|---|
| JP | 2003-309261 | 10/2003 |
| JP | 2004-31923 | 1/2004 |

OTHER PUBLICATIONS

U.S. Appl. No. 10/694,903, filed Oct. 29, 2003, Hideki Okumura, et al.

* cited by examiner

*Primary Examiner*—Jerome Jackson
*Assistant Examiner*—Jose R Diaz
(74) *Attorney, Agent, or Firm*—Oblon, Spivak, McClelland, Maier & Neustadt, P.C.

(57) ABSTRACT

A semiconductor device include a plurality of active element cells including first element regions of a first conductivity type and second element regions of a second conductivity type, the second element regions disposed between the first element regions; and isolation regions disposed between the active element cells so as to isolate the active element cells from each other, the isolation regions being filled with a plurality of semi-insulating particles including granular insulators covered by semiconductor films.

8 Claims, 8 Drawing Sheets

SEMICONDUCTOR DEVICE AND METHOD FOR MANUFACTURING THE SAME

CROSS REFERENCE TO RELATED APPLICATIONS AND INCORPORATION BY REFERENCE

This application is based upon and claims the benefit of priority from prior Japanese patent application P2005-060862 filed on Mar. 4, 2005; the entire contents of which are incorporated by reference herein.

BACKGROUND OF THE INVENTION

1. Field of the Invention

The present invention relates to a semiconductor device having a semi-insulating isolation region, and a method for manufacturing the same.

2. Description of the Related Art

In a power semiconductor device such as a metal-oxide-semiconductor (MOS) field-effect transistor (FET) and a high power metal-insulator-semiconductor (MIS) FET, a vertical structure is suitable for a low on-state resistance and a high blocking voltage. For example, in an n-channel MOSFET, a current flows from a drain in a rear surface of a semiconductor substrate through a drift region of an n-type semiconductor layer into a source in a front surface of the semiconductor substrate. In order to achieve a high blocking voltage, the drift region is depleted. A resistance of the drift region primarily dominates in an on-state resistance of a power MOSFET. If a thickness of the drift region is reduced in order to decrease the on-state resistance, a blocking voltage is decreased.

In order to achieve a low on-state resistance and a high blocking voltage, a MOSFET having a super junction structure has been used. Generally, in a super junction structure, p-type element regions and n-type element regions are disposed adjacent to each other between source and drain regions. In an on-state of the MOSFET, a current flows through the n-type element regions as drift regions. In an off-state of the MOSFET, by depleting the adjacent p-type and n-type element regions, a high blocking voltage is achieved.

The p-type and n-type element regions in the super junction structure are formed in a semiconductor layer on a semiconductor substrate, for example, by doping impurities into sidewalls of deep trenches extending to the semiconductor substrate. Usually, the trenches are filled with dielectrics after formation of super junctions, so as to form isolation regions.

Alternatively, semi-insulating isolation regions have been proposed, in which a semi-insulating polycrystalline silicon (SIPOS) film is used instead of the dielectrics (see Japanese Patent Laid-Open No. 2002-217415). The SIPOS film is formed by oxidizing a deposited polycrystalline silicon (poly-Si). By burying the SIPOS film in trenches after formation of super junctions, high-resistance leakage current paths are provided between the source and the drain regions. As a result, a uniform field distribution is forcibly formed along a direction in which the SIPOS film is buried. Thus, an expected advantage is that a reduced surface field (RESURF) effect for the element regions is enhanced. Here, "RESURF" refers to a kind of junction termination which controls an electric field concentration in the vicinity of a p-n junction when a high voltage is applied.

However, it is difficult to control the oxygen (O) concentration included in the SIPOS film during the formation of the SIPOS film, which influences the resistance of the semi-insulating isolation regions. Thus, an O concentration distribution occurs in a depth direction in the SIPOS film. As a result, when planarizing the SIPOS film buried in the trenches, processing by wet etching and the like is difficult at a surface side of the SIPOS film having a high oxygen concentration. Moreover, a large film stress of the formed SIPOS film induces crystal defects in the drift region adjacent to the semi-insulating isolation region. Consequently, characteristics of the MOSFET are deteriorated.

SUMMARY OF THE INVENTION

A first aspect of the present invention inheres in a semiconductor device including a plurality of active element cells including first element regions of a first conductivity type and second element regions of a second conductivity type, the second element regions disposed between the first element regions; and isolation regions disposed between the active element cells so as to isolate the active element cells from each other, the isolation regions being filled with a plurality of semi-insulating particles including granular insulators covered by semiconductor films.

A second aspect of the present invention inheres in a method for manufacturing a semiconductor device including growing a semiconductor layer on a semiconductor substrate having a first conductivity type; forming trenches by selectively removing the semiconductor layer so as to form a plurality of active element cells isolated by the trenches; doping first impurity ions of the first conductivity type and second impurity ions of a second conductivity type in the vicinity of sidewalls of the active element cells so as to form first element regions and second element regions, the second impurity ions having larger diffusion coefficient than the first impurity ions, the first element regions formed in the vicinity of the sidewalls, the second element regions formed between the first element regions; and filling the trenches with granular insulators and depositing semiconductor films on surfaces of the granular insulators so as to form isolation regions.

DETAILED DESCRIPTION OF THE INVENTION

Figure 1:
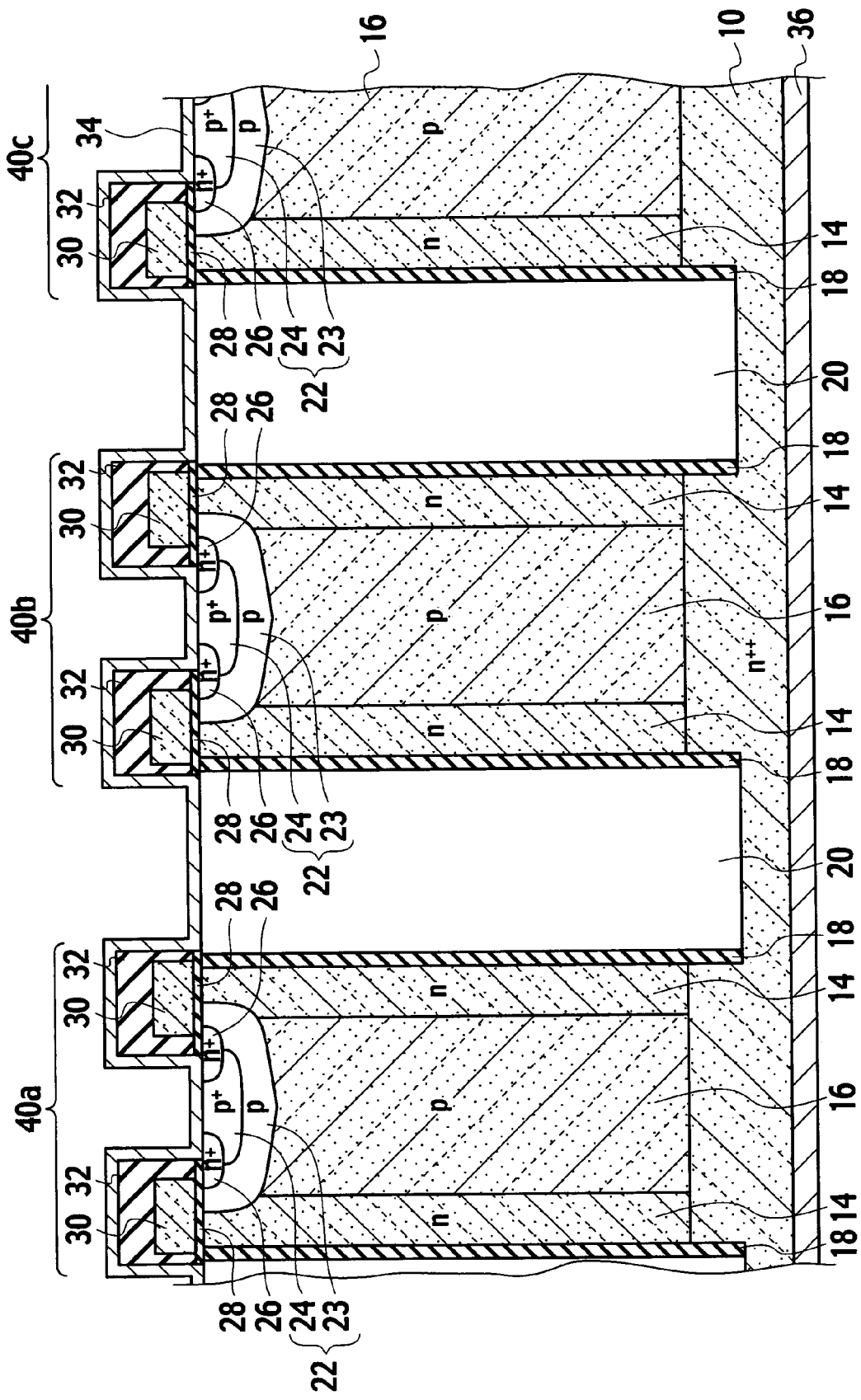
FIG. 1 is a cross sectional view showing an example of a semiconductor device according to an embodiment of the present invention.

Various embodiments of the present invention will be described with reference to the accompanying drawings. It is to be noted that the same or similar reference numerals are applied to the same or similar parts and devices throughout the drawings, and the description of the same or similar parts and devices will be omitted or simplified.

As shown in FIG. 1, a semiconductor device according to an embodiment of the present invention includes a semiconductor substrate 10, a plurality of active element cells 40a, 40b and 40c, and isolation regions 20. The semiconductor substrate 10 is an $n^{++}$-type (a first conductivity type) Si substrate and the like. The active element cells 40a, 40b and 40c are disposed on the semiconductor substrate 10. The isolation regions 20 are disposed between the active element cells 40a to 40c so as to isolate the active element cells 40a to 40c from each other. The bottoms of the isolation regions 20 contact the semiconductor substrate 10. Between the isolation regions 20 and the active element cells 40a to 40c, passivation films 18 such as silicon oxide ($SiO_2$) are disposed. The "active element cell" refers to a region where an active element of a semiconductor device is provided. As an example of the active element, a power MOSFET will be described below. However, the active element is not limited to the power MOSFET. For example, the active element may be a switching element such as a MISFET, a gate turn-off (GTO) thyristor and an insulated gate bipolar transistor (IGBT).

Figure 2:
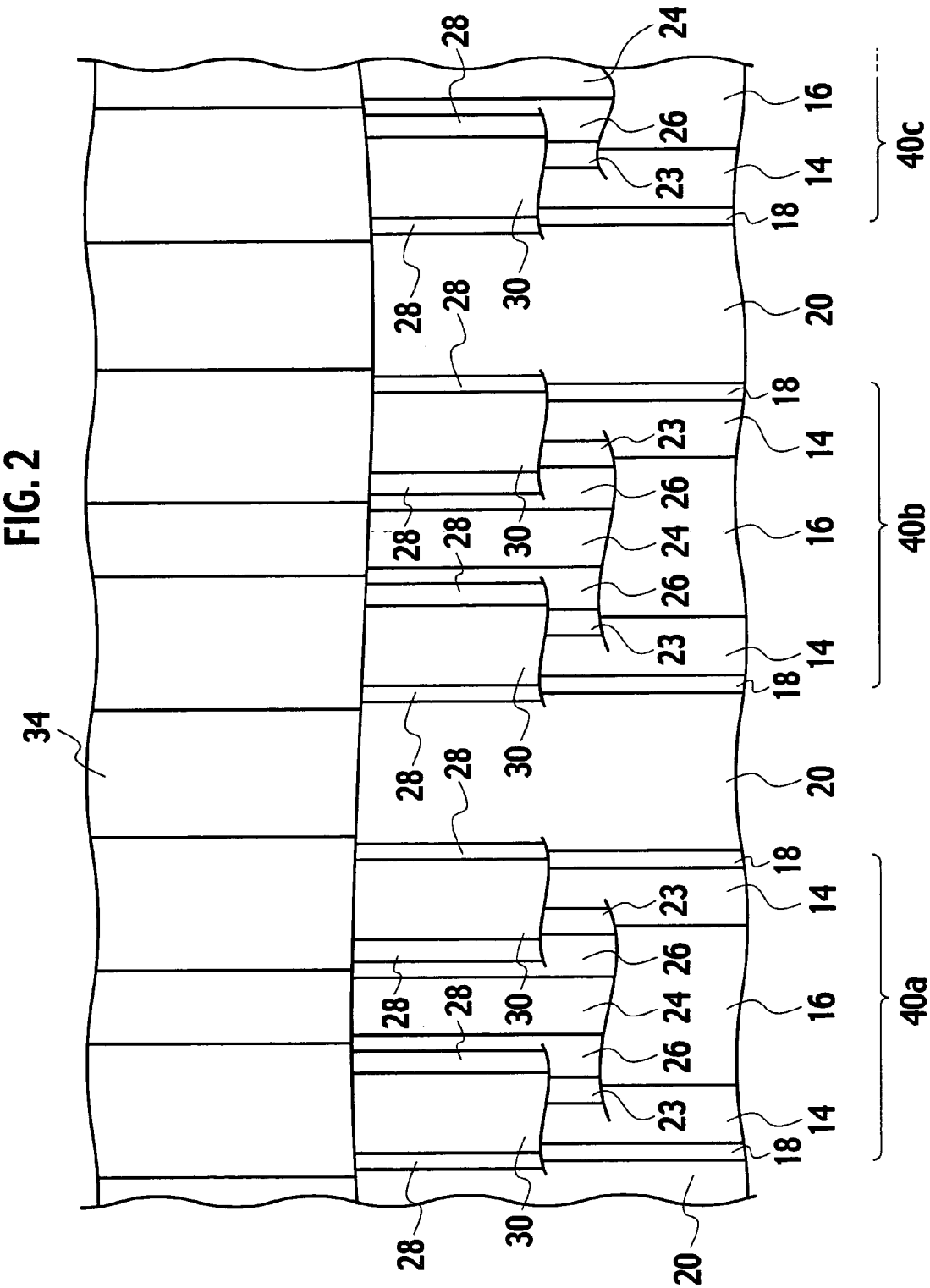
FIG. 2 is a plan view showing an example of a semiconductor device according to the embodiment of the present invention.

Each of the active element cells 40a to 40c which includes n-type first element regions 14 and a p-type (a second conductivity type) second element region 16, is disposed on top of the semiconductor substrate 10. The first element regions 14 are disposed opposite the isolation region 20 behind the passivation film 18. The second element region 16 is disposed between the first element regions 14. As shown in FIG. 2, each planar pattern of the active element cells 40a to 40c is, for example, a striped shape between the isolaton regions 20. Alternatively, a meshed shape is also acceptable for a planar pattern of each active element cell.

Note that the first conductivity type and the second conductivity type are conductivities opposite to each other. Specifically, if the first conductivity type is n-type, the second conductivity type is p-type, and, if the first conductivity type is p-type, the second conductivity type is n-type. In the following description, for convenience, n-type is set as the first conductivity type, and p-type is set as the second conductivity type. However, p-type may be set as the first conductivity type and n-type may be set as the second conductivity type.

Moreover, each of the active element cells 40a to 40c includes a base region (a body region) 22 having a p-type barrier layer 23 and a $p^+$-type contact layer 24. The barrier layer 23 is placed between the first element regions 14 in a surface region of the second element region 16. The contact layer 24 is placed in a surface region of the barrier layer 23. In addition, each of the active element cells 40a to 40c includes $n^+$-type source regions 26 disposed so as to face the first element regions 14 sandwiching the barrier layer 23 in a surface region of the base region 22.

Each of the active element cells 40a to 40c includes gate insulating films 28 such as $SiO_2$, gate electrodes 30 such as poly-Si, and insulating films 32 such as $SiO_2$. The gate insulating films 28 are disposed on the surface of the barrier layer 23 between the source regions 26 and the first element regions 14. The gate electrodes 30 are disposed on a surface of the gate insulating films 28. The insulating films 32 are disposed so as to cover the gate electrode 30. Furthermore, a source electrode 34 disposed on the source regions 26, the base regions 22 and the isolation regions 20, and a drain electrode 36 disposed on a rear surface of the semiconductor substrate 10 are provided.

Figure 3:
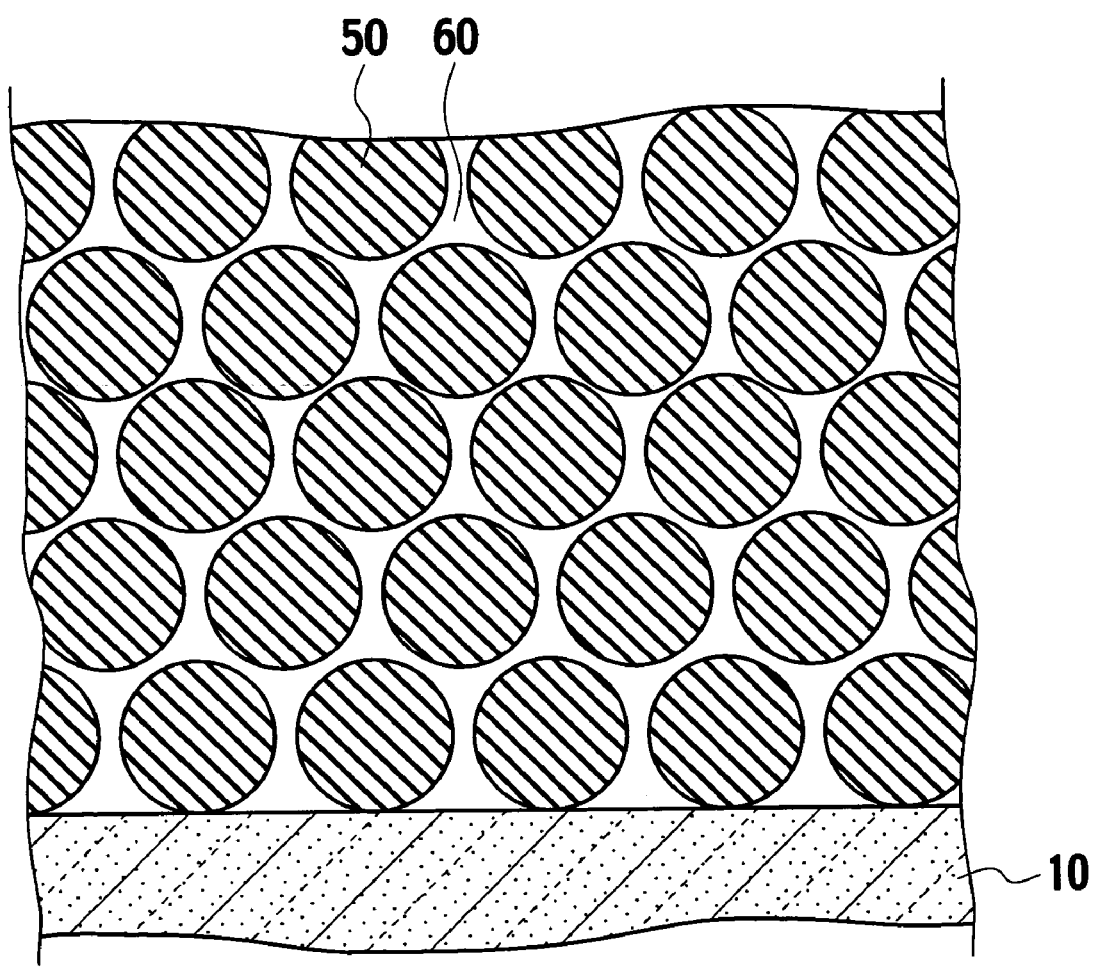
FIGS. 3 and 4 are cross sectional views showing an example of a method for forming a isolation region according to the embodiment of the present invention.
Figure 4:
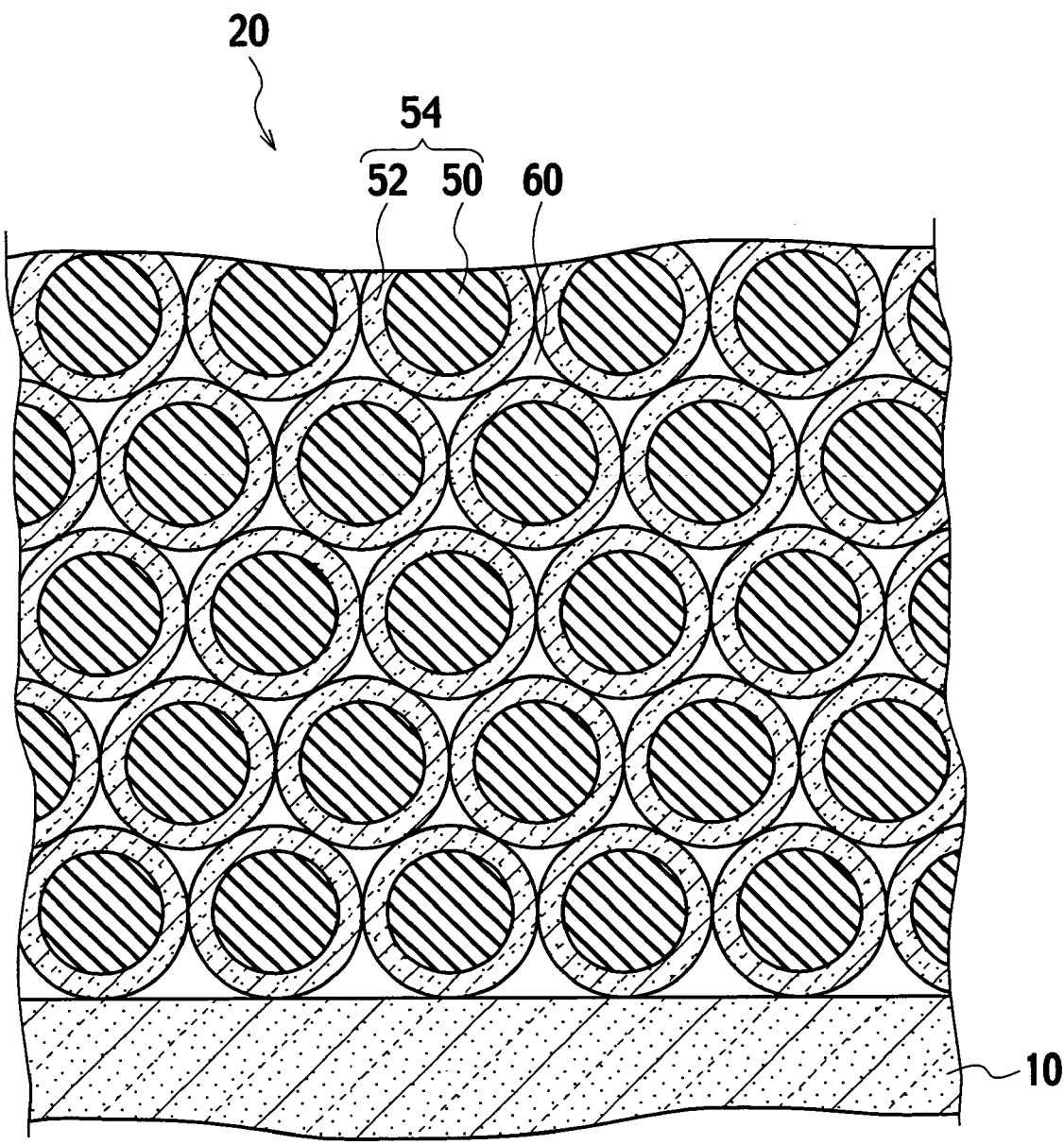

In the isolation regions 20 according to the embodiment of the present invention, semi-insulating films are buried. For example, as shown in FIG. 3, a coating film having granular insulators 50 is formed so as to fill a trench provided on the semiconductor substrate 10 by applying a coating solution containing granular silica and the like. Among the granular insulators 50, air gaps 60 are included. By low-pressure chemical vapor deposition (LPCVD) using a gas such as silane ($SiH_4$), as shown in FIG. 4, semiconductor films 52 such as poly-Si are deposited on surfaces of the granular insulators 50, so as to form semi-insulating particles 54. During the LPCVD process, because of the air gaps 60 among the granular insulators 50, a mean free path of the $SiH_4$ gas may become large. Thus, $SiH_4$ gas can be supplied down to the bottom of the trench. Moreover, the air gaps 60 remain even after the semi-insulating particles 54 are formed.

The granular insulators 50 have an average particle diameter to fill the trench and to be dispersed in the coating solution. Here, the average particle diameter is an average diameter when the granular insulator 50 is assumed to have a spherical shape. The particle diameter is measured, for example, by a laser diffraction scattering method and the like. The film thickness of the semiconductor films 52 are provided within a film stress limit where a crystal defect is induced in the semiconductor layer in the vicinity of the first element region 14, shown in FIG. 1. Poly-Si film, used as the semiconductor films 52, shows a large internal stress. When the poly-Si film is thin, the stress of the poly-Si film is reduced.

To be more specific, the average particle diameter of the granular insulators 50 is desirable in a range of about 30 nm to about 500 nm, for example, for a trench having an opening size of about 5 μm and a depth of about 50 μm. Specifically, if an average particle diameter of the granular silica used as the granular insulator 50 is increased, a density of the air gaps 60 increases. As a result, a density of the poly-Si film decrease so as to reduce the film stress of the poly-Si film. If an average particle diameter of the granular silica used as the granular insulator 50 is too large, it is difficult for the granular silica to be monodisperse in the coating solution. Moreover, a film thickness for the film stress limit of the poly-Si film is about 1 μm. In order to suppress the crystal defect, the film thickness of the semiconductor film 52 is desirably about 1 μm or less. Furthermore, from the viewpoint of the obtained semi-insulating particles 54 having a sufficient semi-insulating property, the film thickness of the semiconductor film 52 is desirable in a range of about 100 nm to about 1 μm.

As described above, the isolation regions 20 filled with the semi-insulating particles 54 have a semi-insulating property with a resistivity in a range of about $10^4$ Ωcm to about $10^8$ Ωcm. Therefore, between the drain electrode 36 and the source electrode 34 shown in FIG. 1, high-resistance leakage current paths are provided. As a result, a uniform electric field distribution can be forcibly formed along a longitudinal direction toward the source electrode 34 from the drain electrode 36.

As described above, in the semiconductor device according to the embodiment of the present invention, the isolation regions 20 filled with the semi-insulating particles 54 are provided. Since the air gaps 60 are included between the semi-insulating particles 54, the film stress in the isolation regions 20 can be reduced.

Note that, in the description of the embodiment of the present invention, the passivation films 18 are disposed between the isolation regions 20 and the first element regions 14. The passivation films 18 are provided to inactivate a surface of the first element region 14. However, the semi-insulating particles 54 may be filled so as to form the isolation regions 20 abutting on sidewalls of the first element regions 14 without providing the passivation films 18.

A method for manufacturing a semiconductor device according to the embodiment of the present invention will be described with reference to cross-sectional views shown in FIGS. 5 to 11.

Figure 5:
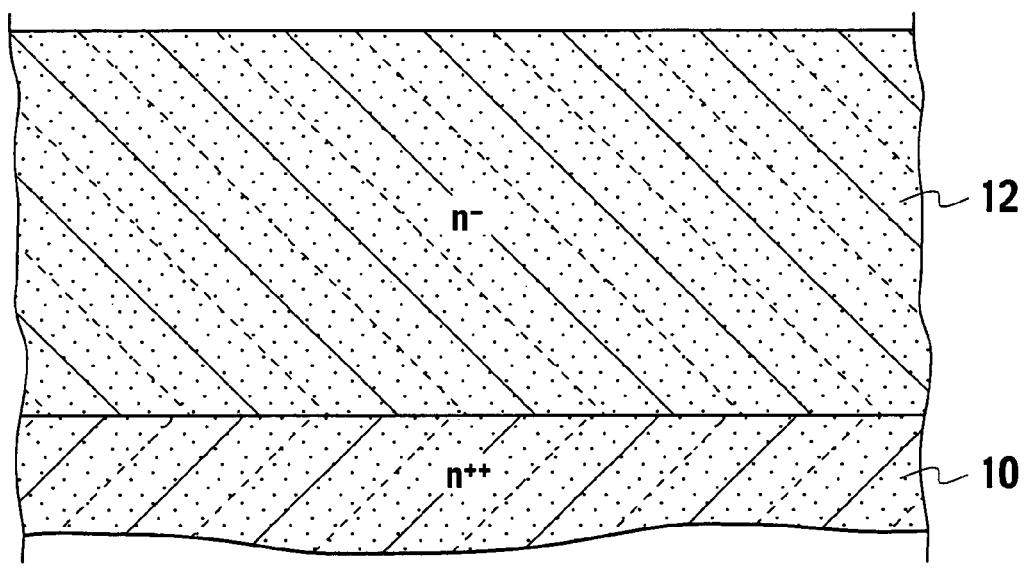
FIGS. 5 to 11 are cross section views showing an example of a method for manufacturing a semiconductor device according to the embodiment of the present invention.

As shown in FIG. 5, by epitaxial growth and the like, a semiconductor layer 12, such as n-type Si, is grown on a semiconductor substrate 10, such as $n^{++}$-type Si. An impurity concentration of the semiconductor substrate 10 is, for example, $1 \times 10^{19}$ $cm^{-3}$ or more. The semiconductor layer 12 has a thickness of about 50 μm and an impurity concentration in a range of about $5 \times 10^{13}$ $cm^{-3}$ to $1 \times 10^{14}$ $cm^{-3}$.

Figure 6:
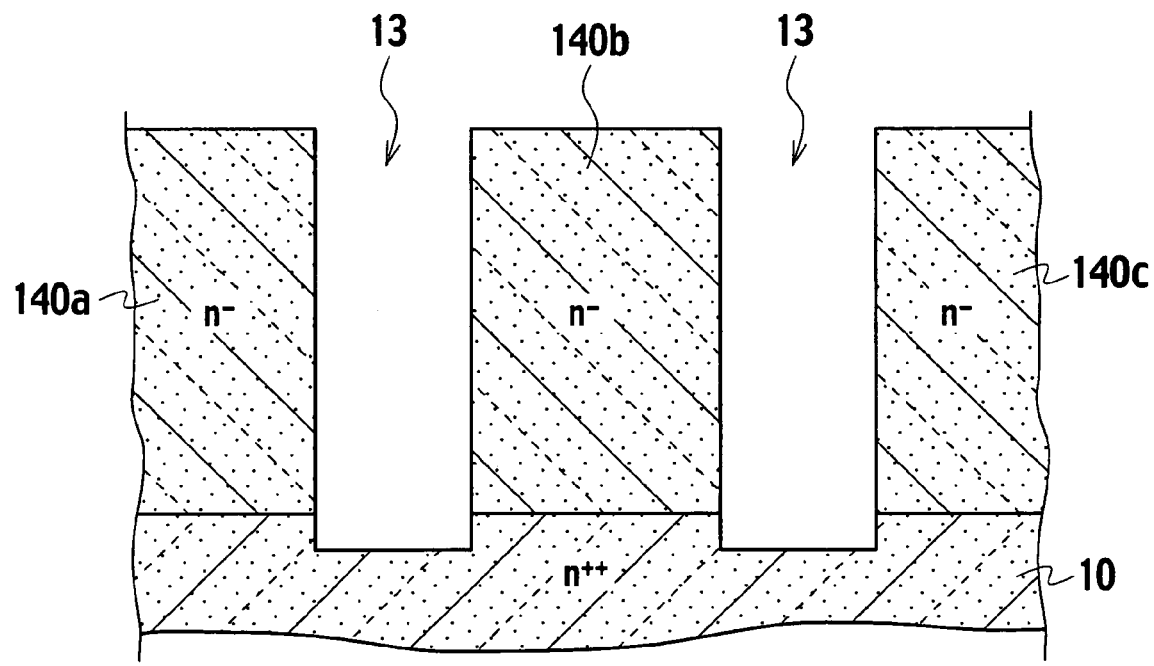

As shown in FIG. 6, by photolithography, reactive ion etching (RIE), and the like, the semiconductor layer 12 is selectively removed to form deep trenches 13 extending to the semiconductor substrate 10. Each of the trenches 13 has a depth of about 51 µm to about 55 µm and an opening size of about 8 µm, for example. Each sidewall of the trenches 13 is formed approximately perpendicular to a surface of the semiconductor substrate 10. Moreover, each of active element cells 140a to 140c isolated by the trenches 13 has a width of about 15 µm.

Figure 7:
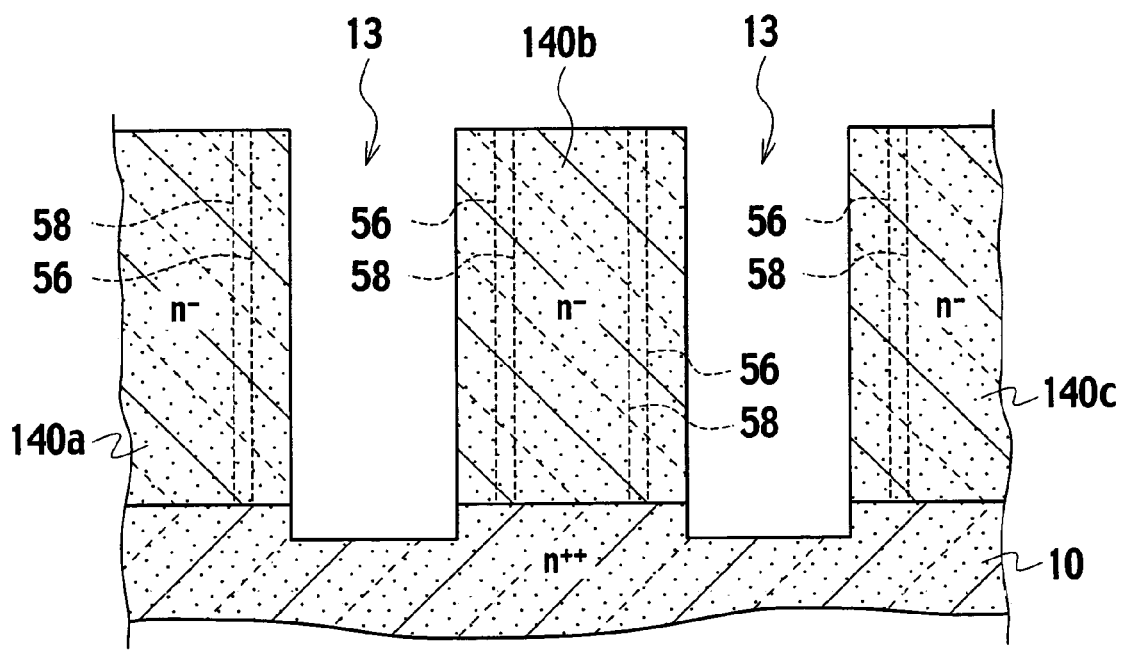

As shown in FIG. 7, by rotation-tilt ion implantation and the like, arsenic (As) and boron (B) are implanted in the vicinity of the sidewalls of the active element cells 140a to 140c from the trenches 13 at an implant angle. A tilt angle of the semiconductor substrate 10 is about 2° to about 7°. In the active element cells 140a to 140c, impurity implanted regions 56 of As, and impurity implanted regions 58 of B are formed.

Figure 8:
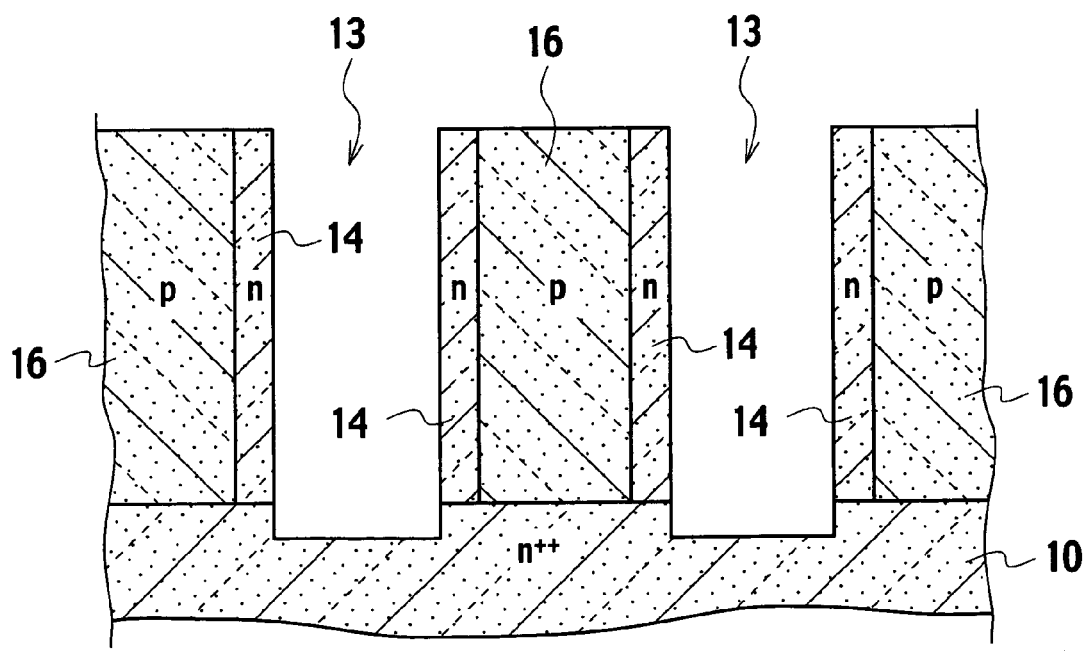

By activation annealing for about 45 hours at about 1150° C., and the like, As and B are electrically activated while diffusing in the active element cells 140a to 140c. Diffusion coefficients of As and B at the temperature of 1150° C. are about $9 \times 10^{-3}$ µm²/h and $5.5 \times 10^{-2}$ µm²/h, respectively. B has a larger diffusion coefficient than As. As is diffused by about 2.5 µm, and B is diffused by about 7.5 µm. As a result, as shown in FIG. 8, n-type first element regions 14 are formed in the vicinity of the sidewalls of the active element cells 140a to 140c, and p-type second element region 16 is formed so as to be sandwiched between the first element regions 14.

Figure 9:
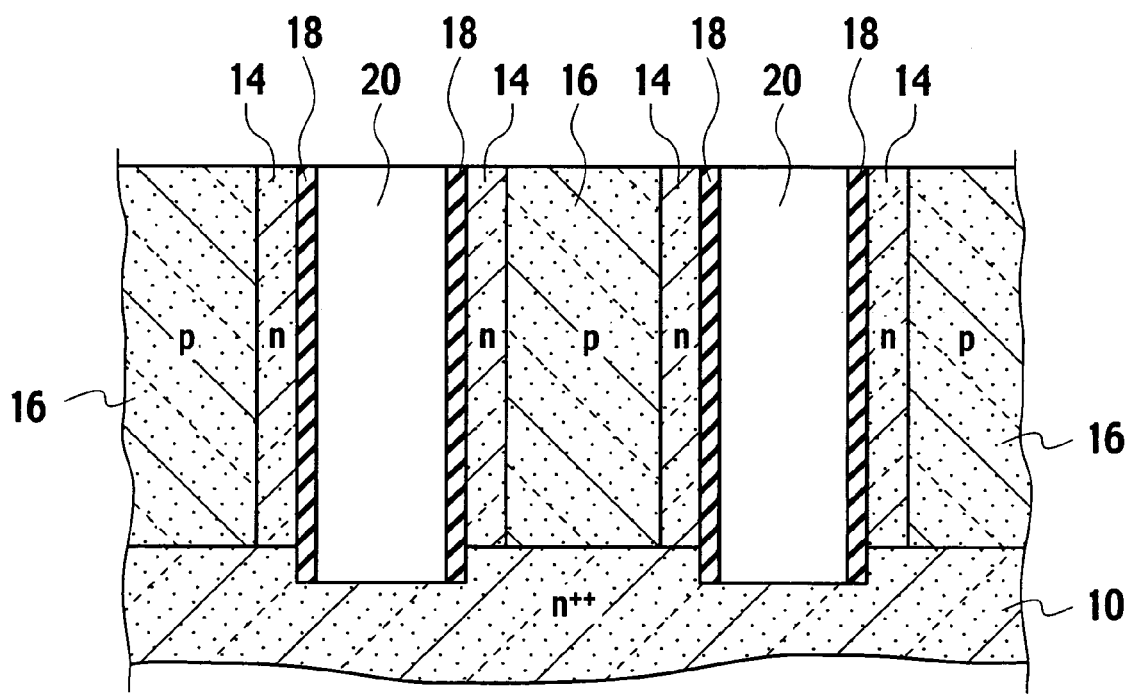

As shown in FIG. 9, by thermal oxidation, RIE, and the like, passivation films 18 are selectively formed on the sidewalls of the first element regions 14. By using a coating solution containing granular silica and the like, a coating film having granular insulators 50 shown in FIG. 3 is formed so as to fill the trenches 13. By chemical mechanical polishing (CMP) and the like, the coating film is planarized so as to expose surfaces of the first and second element regions 14 and 16. For the granular insulators 50, such as granular silica, the coated film can be easily processed selectively to remain in the trenches 13, even by polishing using purified water and the like. Subsequently, by LPCVD and the like, semiconductor films 52, such as poly-Si, are deposited on surfaces of the granular insulators 50 as shown in FIG. 4. Furthermore, by RIE and the like, the poly-Si films deposited on the surfaces of the first and second element regions 14 and 16 are selectively removed to form isolation regions 20 having semi-insulating particles 54. Since the poly-Si films can be formed with uniform film characteristics, highly controllable etching can be performed without causing a fluctuation in an etching rate, as opposed to the case of a SIPOS film.

Figure 10:
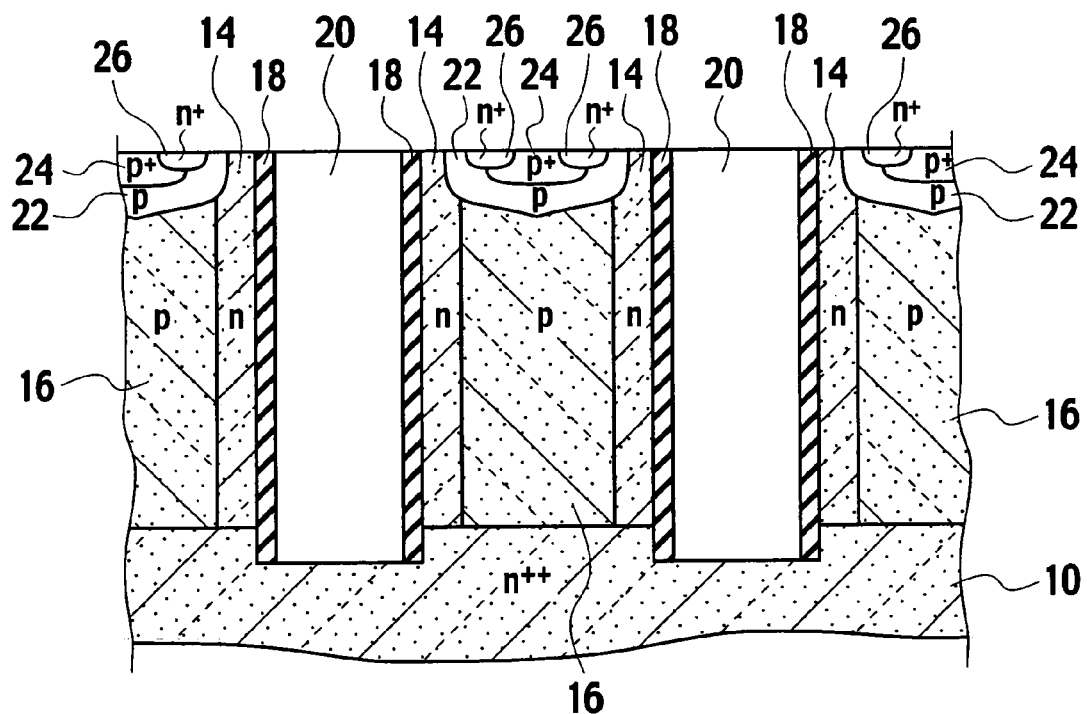

As shown in FIG. 10, by photolithography, ion implantation, and the like, base regions 22, each having a p-type barrier layer 23 and a p⁺-type contact layer 24, are formed in the surface regions of the second element regions 16. Furthermore, by photolithography, ion implantation, and the like, n⁺-type source regions 26 are selectively formed in surface regions of the base regions 22. The barrier layers 23 are provided between the first element regions 14. The contact layers 24 are surrounded by the barrier layers 23 in the surface regions of the base regions 22. The source regions 26 are provided so as to face the first element regions 14 sandwiching the barrier layers 23.

Figure 11:
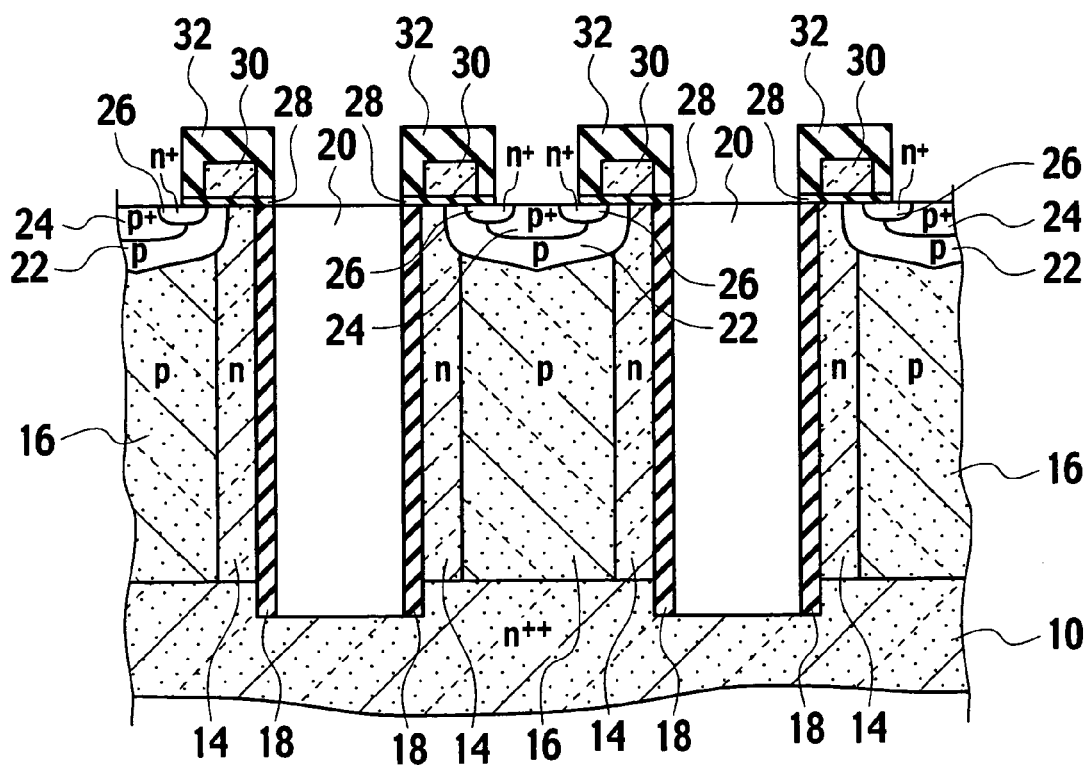

As shown in FIG. 11, by thermal oxidation, CVD, photolithography, RIE, and the like, gate insulating films 28 and gate electrodes 30 covered by insulating films 32 are formed on surfaces of the barrier layer 23 between the first element regions 14 and the source regions 26. Furthermore, a source electrode 34 is formed on surfaces of the contact layers 24 of the base regions 22, the source regions 26 and the isolation regions 20. A drain electrode 36 is formed on a rear surface of the semiconductor substrate 10. Thus, a semiconductor device shown in FIG. 1 is manufactured.

In a method for manufacturing a semiconductor device according to the embodiment of the present invention, the semi-insulating particles 54 fill the isolation regions 20. Since air gaps 60 are included among the semi-insulating particles 54, a film stress in the isolation regions 20 can be reduced. The granular insulators 50 and the semiconductor films 52 of the semi-insulating particle 54 are granular silica, poly-Si, and the like. The granular silica and poly-Si can be easily polished and etched. Therefore, the isolation regions 20 can be easily processed.

OTHER EMBODIMENTS

In the description of the embodiment of the present invention, silica is used as the granular insulators 50. However, the granular insulators 50 are not limited to silica. For example, titania ($TiO_2$), zirconia ($ZrO_2$), alumina ($Al_2O_3$), and the like, can be used as other insulators. As the semiconductor film 52, poly-Si is used. However, a semiconductor crystal such as germanium (Ge), an alloyed semiconductor crystal such as silicon carbide (SiC), and the like, may be used. Furthermore, the semiconductor film 52 is not limited to a polycrystalline film but may be an amorphous film, and the like.

Various modifications will become possible for those skilled in the art after storing the teachings of the present disclosure without departing from the scope thereof.

What is claimed is:

1. A semiconductor device, comprising:
    a plurality of active element cells including first element regions of a first conductivity type and second element regions of a second conductivity type, the second element regions disposed between the first element regions; and
    isolation regions disposed between the active element cells so as to isolate the active element cells from each other, the isolation regions being filled with a plurality of semi-insulating particles including granular insulators covered by semiconductor films.

2. The semiconductor device of claim 1, wherein the isolation regions include air gaps between the semi-insulating particles.

3. The semiconductor device of claim 1, wherein an average particle diameter of the granular insulators is in a range of about 30 nm to about 500 nm.

4. The semiconductor device of claim 1, wherein the semiconductor films are at least one of silicon, germanium, and silicon carbide.

5. The semiconductor device of claim 1, wherein the semiconductor films are polycrystalline silicon with a film thickness of less than or equal to about 1 µm.

6. The semiconductor device of claim 1, wherein the granular insulators are at least one of silica, titania, zirconia, and alumina.

7. The semiconductor device of claim 1, wherein the isolation regions have a semi-insulating property with a resistivity in a range of about $10^4$ Ωcm to about $10^8$ Ωcm.

8. The semiconductor device of claim 1, wherein the active element cells comprise:
    second conductivity type base regions disposed in surface regions of the second element regions;
    first conductivity type source regions disposed in surface regions of the base regions so as to face the first element regions; and
    gate electrodes disposed on gate insulating films which is disposed on surfaces of the base regions between the source regions and the first element regions.

* * * * *